United States Patent
Kang

[11] Patent Number: 6,000,125
[45] Date of Patent: Dec. 14, 1999

[54] METHOD OF HEAT DISSIPATION FROM TWO SURFACES OF A MICROPROCESSOR

[75] Inventor: Ki B. Kang, Centreville, Va.

[73] Assignee: Samsung Electronics America, Inc., Ridgefield Park, N.J.

[21] Appl. No.: 09/069,994

[22] Filed: Apr. 30, 1998

Related U.S. Application Data

[63] Continuation of application No. 08/594,289, Jan. 30, 1996, abandoned, and a division of application No. 08/968,848, Nov. 5, 1997, Pat. No. 5,790,379.

[51] Int. Cl.$^6$ ........................................................ H05K 3/30
[52] U.S. Cl. ............................. 29/832; 29/832; 261/717; 261/709; 257/720; 257/719
[58] Field of Search ..................... 29/830, 832; 361/709, 361/710, 717, 719; 257/718, 719, 720

[56] References Cited

U.S. PATENT DOCUMENTS

| | | | |
|---|---|---|---|
| 4,509,096 | 4/1985 | Baldwin | 361/386 |
| 5,311,060 | 5/1994 | Rostoker | 257/796 |
| 5,386,339 | 1/1995 | Polinski, Sr. | 361/719 |
| 5,464,054 | 11/1995 | Hinshaw et al. | 257/719 |
| 5,533,256 | 7/1996 | Call et al. | 29/840 |

*Primary Examiner*—Lee W. Young
*Assistant Examiner*—Sean P. Smith
*Attorney, Agent, or Firm*—Jones Volentine, L.L.P.

[57] ABSTRACT

A natural heat dissipation device for a microprocessor. The microprocessor is conventionally mounted to a printed circuit board. The printed circuit board contains a recess that is cut-out directly below the microprocessor. Heat sink material is attached to the microprocessor through the recess. The heat sink material attached to the bottom of the microprocessor may be used alone or in conjunction with a an attached metal tray or case under the printed circuit board.

6 Claims, 3 Drawing Sheets

METHOD OF HEAT DISSIPATION FROM TWO SURFACES OF A MICROPROCESSOR

CROSS REFERENCE TO RELATED APPLICATIONS

This is continuation application of Ser. No. 08/594,289, filed Jan. 30, 1996 now abandoned and is a divisional application of application Ser. No. 08/968,848, filed Nov. 5, 1997 now U.S. Pat. No. 5,790,379.

BACKGROUND OF THE INVENTION

1. Field of the Invention

The present invention generally relates to heat sinks for semiconductor devices, and more particularly, to a surface complemental heat dissipation heat sink.

2. Description of the Related Art

Heat is the flow of energy due to the existence of a temperature differential between two geographically separated points. One of the basic tenants in designing semiconductor devices is to ensure the devices operate at safe temperature levels.

Poorly designed heat sinks result in large thermal resistances, high semiconductor temperatures, poor electrical performance, and premature failure. Any design, therefore, must provide for adequate heat removal.

It is common practice to view the thermal flow path as a series of resistances (R) between power dissipating chips and the heat sink. Thermal resistance is somewhat analogous to electrical resistance in that heat flow is directly proportional to the temperature drop in the direction of the heat flow path. In flowing from the chip to the package surface or case, the heat encounters a series or resistances associated with individual layers of materials such as silicon, solder, copper, alumina, and epoxy, as well as the contact resistances that occur at the interfaces between pairs of materials. The amount of heat generated can be quantified via simple calculations involving the relevant thermal parameters. These are power dissipation (Q), in watts (W), the temperature difference between endpoints (T), in °C., and thermal resistance (R), in °C./W, where $Q=T/R$.

Advances in microprocessor technology have resulted in present day chips with greatly increased device densities that are operating at higher and higher clock speeds. For example, in a prototype 64 Mb DRAM chip, up to 140 million transistors are placed on a 1 cm by 2 cm silicon chip, with a feature size of 0.3–0.4 $\mu$m. Based on current trends, thermal management of multi-chip modules can be expected to require removal of as much as 25–35 $W/cm^2$.

Obviously, without adequate heat removal and thermal management, the transistor device will experience a destructive rise in junction temperature above the maximum allowable level. It is critical, therefore, to provide an effective heat dissipation system for the microprocessor to ensure system reliability.

In most systems, heat dissipation is accomplished through forced and natural convection, and typically a combination of the two. Convection is the transfer of heat to or from a surface by a moving fluid, such as air. Fluid motion may be produced by a fan (i.e., forced convection) or may result from buoyancy effects due to the presence of temperature gradients within the fluid (i.e., natural convection). Forced convection may include a system fan or a fan mounted directly on top of the microprocessor. Aluminum heat sinks directly attached on the microprocessor are a widely used method of natural convection.

There are drawbacks, however, to both methods of heat dissipation. In forced convection, for example, while most fans are generally effective in dissipating heat, they do require an isolated power supply and must be designed to be noise-free. Additional reliability risks and manufacturing and maintenance costs are also introduced. Furthermore, many military and telecommunications applications must meet design specifications which require equipment or systems that can be run without fans for a certain period of time. Finally, when using a cooling fan one must assess the nature of the moving air in the region near the heat sink. Not only is the air velocity an important factor, but one must take into account whether the air motion is laminar or turbulent.

Regarding natural convection, we know that the effectiveness of a natural heat sink is directly proportional to its surface area. In a microelectronic system, however, the surface area available for a heat sink is usually limited by the allowed area and height on a printed circuit board (PCB). In other words, the available height of the heat sink is limited to ensure it does not extend into a neighboring PCB. Nor should the surface area of the heat sink be so large as to cover other components or test points on the particular PCB.

Thus, a need exists for a heat dissipation device that increases the natural heat dissipation capacity of conventional microelectronic systems while working within the space constraints of the systems.

SUMMARY OF THE INVENTION

Accordingly, the present invention is directed to a heat sink for a semiconductor device which substantially obviates or overcomes one or more limitations of the prior art.

The invention is directed to a surface complemental or supplemental heat dissipation device and method which provides for a larger heat sink area and better contact area between the microprocessor and the heat sink, resulting in increased heat dissipation.

By using the heat dissipation device of the present invention, the only remaining available large surface area of the microprocessor, namely the bottom side, is used for heat dissipation. The sides of the microprocessor are generally too small to provide any appreciable heat dissipation.

An additional advantage is that heat that is normally trapped between the PCB and the microprocessor is now released through the recess area, resulting in less heat related failures.

To achieve these and other advantages and in accordance with the purpose of the invention, as embodied and broadly described, the invention is a heat dissipation device for a microprocessor, comprising a printed circuit board for mounting the microprocessor, the printed circuit board having a recess therein, and said recess being directly below said microprocessor; heat sink material housed in the recess; and means for attaching the heat sink material to a bottom surface of the microprocessor through the recess to dissipate heat.

In another embodiment, the invention is directed to a method of providing natural heat dissipation for a microprocessor, the method comprising the steps of (1) providing a printed circuit board for mounting the microprocessor; (2) cutting a recess into the printed circuit board, the recess being directly below the microprocessor; (3) attaching heat sink material to a bottom surface of the microprocessor through the recess; and (4) dissipating heat through the attached heat sink material.

BRIEF DESCRIPTION OF THE DRAWINGS

The foregoing and other objects, aspects, and advantages will be better understood from the following detailed description of the embodiments of the invention with reference to the drawings, in which.

DETAILED DESCRIPTION OF THE INVENTION

The invention is directed to a supplemental natural heat dissipation device and method. The heat dissipation device provides a larger heat sink surface area and better contact area between the microprocessor and the heat sink, resulting in increased heat dissipation. Due to the relation between natural and forced convection heat dissipations, this heat dissipation device and method improves the efficiency of both convection methods.

Figure 2:
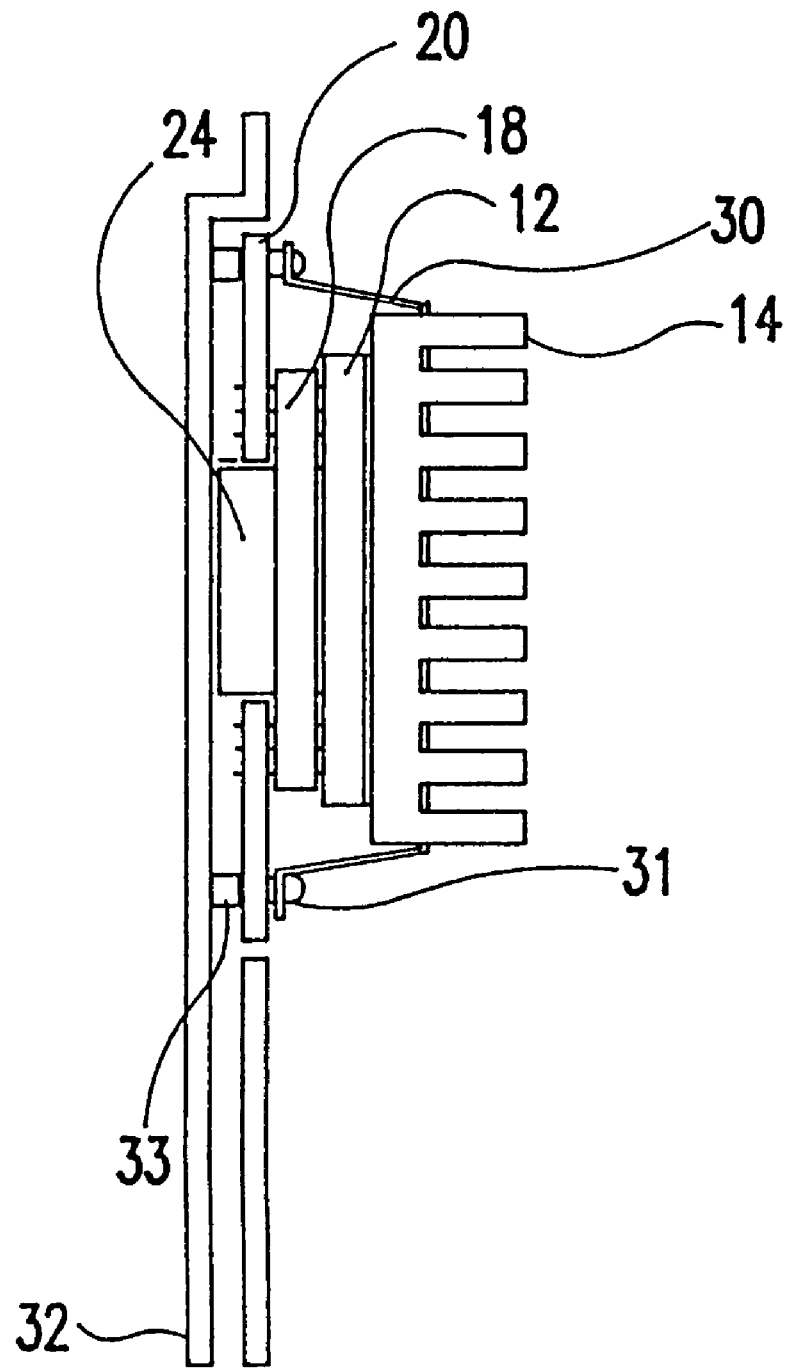
FIG. 2 is a side plan view of the device of FIG. 1.
Figure 3:
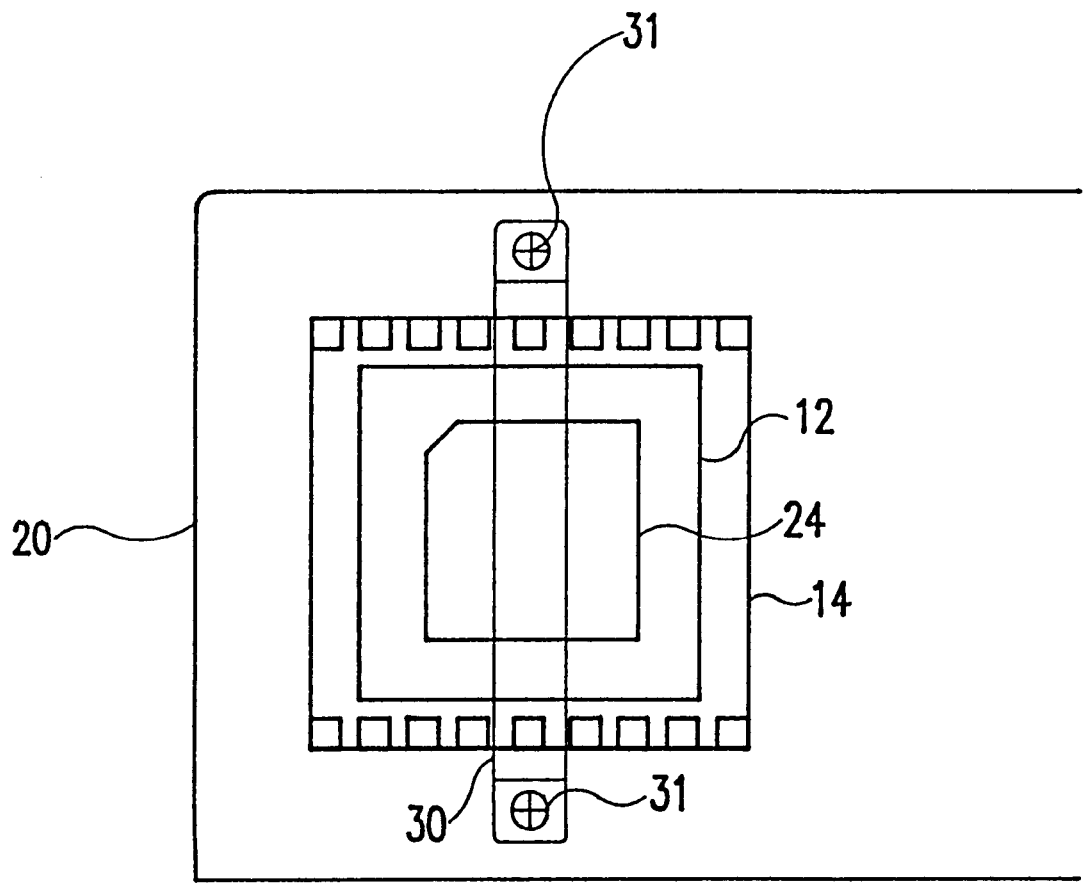
FIG. 3 is a top plan view of the device of FIG. 1.

Reference will now be made in detail to one embodiment of the subject invention, an example of which is illustrated in the accompanying drawings, in sufficient detail to appropriately describe the apparatus and method of the present invention. Note that the dimensions shown in FIGS. 2 and 3 depict just one representative embodiment. It is understood that the heat dissipation device of the present invention may be utilized with microprocessors of any size.

Figure 1:
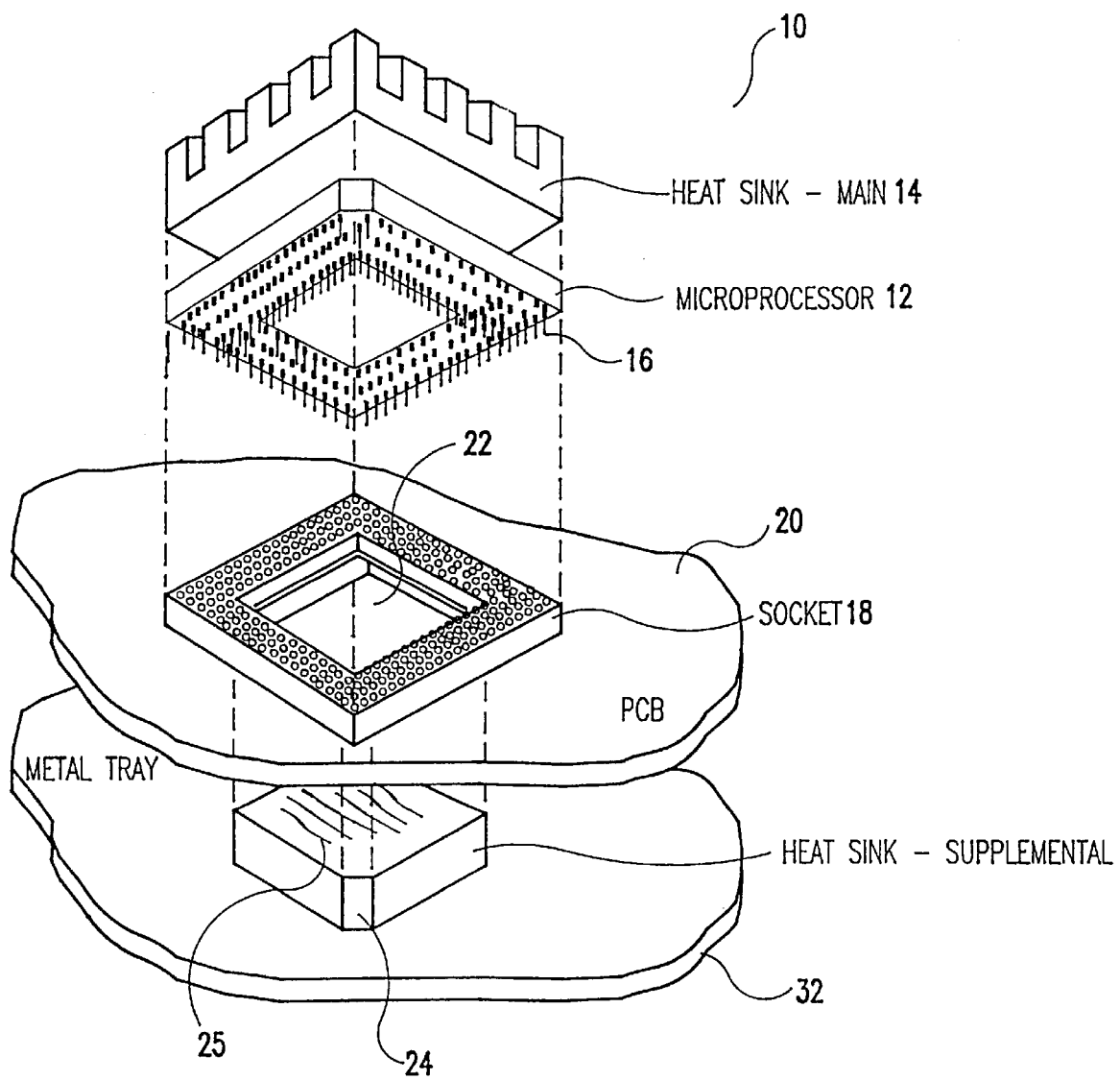
FIG. 1 is an exploded perspective view of the complemental natural heat dissipation device of the present invention.

An exemplary embodiment of the surface complemental natural heat dissipation device is shown in FIG. 1 and is designated generally as reference numeral 10. The device contains a microprocessor 12 and a main heat sink 14. The microprocessor 12 may be any conventional high-speed microprocessor. The heat dissipation device of the present invention is especially useful with microprocessors having clock speeds of greater than 25 MHz.

The main heat sink 14 material is usually composed of aluminum or copper, but may be comprised of any other suitable material. In deciding between copper and aluminum, if the comparison is based on density or weight, aluminum turns out to be the superior heat conductor. If, however, the comparison is based on cross-sectional area, copper excels. Both metals are easy to fabricate in various shapes. In the end, aluminum tends to be the popular choice of most heat sink manufacturers.

As shown in FIG. 1 the main heat sink 14 is finned, that is, it is comprised of spaced fins to increase the heat dissipation due to natural convection. The main heat sink 14 may be secured to the microprocessor 12 using adhesive or thermal tape. The main heat sink 14 may also secured by a metal clip 30 attached to the printed circuit board (PCB) 20 as shown in FIG. 2. While the main heat sink may be selected from any commercially available source, the clip 30 would have to be specifically designed for the package. The clip 30 is secured to the PCB 20 by a screw 31 or other equivalent fastening means. A top view of the interaction of the clip 30 and the screw or fastening means 31 is shown in FIG. 3.

Referring again to FIG. 1, there is shown the plurality of microprocessor leads 16 being connected to a conventional socket 18 mounted on the printed circuit board (PCB) 20. In the present invention, however, a rectangular recess area 22 is cut out of the PCB 20 directly below the microprocessor 12. The bottom surface of the microprocessor is now exposed, which allows this area to be used for a supplemental heat dissipation channel as discussed further below.

A piece of aluminum, copper, or other suitable heat sink material 24, approximately corresponding to the rectangular recess area 22, is attached to the bottom of the processor through the recess area 22. This heat sink material 24 acts as a supplemental or complementary natural heat sink. The complemental heat sink 24 is specifically designed to accommodate the rectangular recess. It is understood, however, that the scope of the present invention encompasses many variations in the size and shape of the complemental heat sink. The final dimensions of the complemental heat sink 24 would depend on the specific microprocessor, the particular application, the amount of heat sought to be removed, and the available space limitations.

The attachment of the complemental heat sink 24 to the bottom of the microprocessor 12 may be effected by any conventional means, such as thermally conductive tape or adhesive 25, on the top surface of the complemental heat sink 24.

As shown in FIGS. 1 and 2, in some microelectronic systems, a PCB tray 32 is provided, whether for stability of a multi-board implementation or for ease of insertion and removal of the particular PCB. In the event there is a metal tray 32 below the microprocessor, the bottom side of the complemental heat sink 24 may also be provided with thermally conductive tape or adhesive 25, or other conventional attachment means, for attachment to the tray 32. With this configuration, the tray 32 acts as a further heat dissipation surface for the microprocessor 12.

Furthermore, a tight bond between the complemental heat sink 24, the microprocessor 12, and the PCB tray 32 may be maintained by the interaction of the screw or fastening means 31 (associated with the clip 30) and the PCB tray 32. With reference to FIG. 2, it can be appreciated that by tightening screws 31 into screw posts 33, the clip 30 presses the main heat sink 14 towards the PCB 20 on one side while the tray 32 is drawn towards the PCB 20 on the other. In this way, the complemental heat sink 24 is pressed against the microprocessor 12 and the PCB tray 32.

FIG. 3 is a top view of the resulting structure, illustrating the orientation of the microprocessor 12, the main heat sink 14, and clips 30, which fasten the main heat sink 14 to the PCB 20 via fastening means 31.

In summary, by using the heat dissipation device of the present invention, the only remaining available large surface area of the microprocessor, namely the bottom side, can be used for heat dissipation. In other words the maximum surface area of the microprocessor 12, that is, both the top and bottom surfaces, may be used for heat dissipation. The sides of the microprocessor are generally to small to provide any appreciable heat dissipation.

An additional advantage of the present invention is that the heat which is normally trapped between the PCB 20 and the microprocessor may now be released through the recess area 22, resulting in less heat related failures.

It will be apparent to those skilled in the art that various modifications and variations can be made in the system and method of the present invention without departing from the spirit or scope of the invention. Thus, it is intended that the present invention cover the modifications and variations of this invention provided they come within the scope of the appended claims and their equivalents.

Having thus described my invention, what I claim as new and desire to secure by Letters Patent is as follows:

1. A method of natural heat dissipation for a microprocessor, comprising:

cutting a recess into a printed circuit board, said recess extending from a top surface of the printed circuit board to a bottom surface of the printed circuit board;

mounting said microprocessor directly above said recess in said printed circuit board;

attaching a main heat sink to a top surface of said microprocessor;

dissipating heat from said top surface of said microprocessor through said main heat sink;

attaching a supplemental heat sink to the bottom surface of said microprocessor through said recess in the printed circuit board; and dissipating heat from the bottom surface of said microprocessor through the attached supplemental heat sink.

2. The method of heat dissipation of claim 1, wherein said attaching the supplemental heat sink to the bottom surface of said microprocessor is performed with a thermally conductive tape.

3. The method of claim 1, further comprising:

attaching a printed circuit board tray to said printed circuit board;

attaching said supplemental heat sink to said printed circuit board tray; and further dissipating heat from said bottom surface of said microprocessor through said printed circuit board tray.

4. The method of claim 3, wherein said attaching said supplemental heat sink to said printed circuit board tray is performed with a thermally conductive tape.

5. The method of claim 3, wherein said printed circuit board tray has a plurality of screw posts affixed thereto, and wherein said attaching said printed circuit board tray to said printed circuit board comprises:

passing a plurality of screws through said printed circuit board; and affixing said plurality of screws to said screw posts.

6. The method of claim 5, wherein said attaching a main heat sink to said microprocessor, comprises:

attaching a clip to said main heat sink; and affixing said clip to said printed circuit board by said plurality of screws.

* * * * *